US006651321B2

(12) United States Patent
Beroz et al.

(10) Patent No.: US 6,651,321 B2
(45) Date of Patent: Nov. 25, 2003

(54) MICROELECTRONIC JOINING PROCESSES

(75) Inventors: Masud Beroz, Livermore, CA (US); Belgacem Haba, Cupertino, CA (US); Klaus-Jurgen Wolter, Dresden (DE)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/523,513

(22) Filed: Mar. 10, 2000

(65) Prior Publication Data

US 2003/0041451 A1 Mar. 6, 2003

Related U.S. Application Data

(60) Provisional application No. 60/148,612, filed on Aug. 12, 1999, and provisional application No. 60/123,602, filed on Mar. 10, 1999.

(51) Int. Cl.[7] ............................................. H05K 3/34
(52) U.S. Cl. ...................... 29/840; 29/832; 29/740; 228/180.22; 361/743; 361/764; 174/260
(58) Field of Search .................... 29/840, 832, 841, 29/843, 740, 842; 174/260, 261, 262, 52.1; 361/743, 764, 303; 228/180.22, 104, 189

(56) References Cited

U.S. PATENT DOCUMENTS

| | | | | |
|---|---|---|---|---|
| 5,133,495 A | * | 7/1992 | Angulas et al. ........... 228/180.1 |
| 5,148,265 A | | 9/1992 | Khandros et al. .............. 357/80 |
| 5,148,266 A | | 9/1992 | Khandros et al. .............. 357/80 |
| 5,203,076 A | * | 4/1993 | Banerji et al. ................. 29/840 |
| 5,232,532 A | * | 8/1993 | Hori |
| 5,346,861 A | | 9/1994 | Khandros et al. ............ 437/209 |
| 5,431,328 A | * | 7/1995 | Chang et al. ........... 228/180.22 |
| 5,518,964 A | | 5/1996 | DiStefano et al. ........... 437/209 |
| 5,578,527 A | * | 11/1996 | Chang et al. ................ 437/209 |
| 5,659,952 A | | 8/1997 | Kovac et al. ................... 29/840 |
| 5,706,174 A | | 1/1998 | DiStefano et al. ........... 361/749 |
| 5,766,987 A | | 6/1998 | Mitchell et al. ............. 438/126 |
| 5,776,796 A | | 7/1998 | DiStefano et al. ........... 438/106 |
| 5,798,286 A | | 8/1998 | Faraci et al. ................. 438/113 |
| 5,801,446 A | | 9/1998 | DiStefano et al. ........... 257/778 |
| 5,834,339 A | | 11/1998 | DiStefano et al. ........... 438/125 |
| 5,843,251 A | * | 12/1998 | Tsukagoshi et al. .......... 29/832 |
| 5,861,678 A | * | 1/1999 | Schrock ....................... 257/783 |
| 5,885,849 A | * | 3/1999 | DiStefano et al. ........... 438/108 |
| 5,915,752 A | | 6/1999 | DiStefano et al. ............. 29/827 |
| 5,989,936 A | * | 11/1999 | Smith et al. ................. 438/106 |
| 6,189,208 B1 | * | 2/2001 | Estes et al. .................... 29/840 |
| 6,324,754 B1 | * | 12/2001 | DiStefano et al. ............. 29/840 |
| 6,460,245 B1 | * | 10/2002 | DiStefano ...................... 29/840 |

OTHER PUBLICATIONS

WO 00/54321, PCT,/US00/06257, Mar. 10, 2000, Tessera, Inc., Beroz et al.*
Multi–Chip Module Technologies and Alternatives; the Basics (Doame and Franzon, eds., 1993, pp. 450–476).
Flux Free Process for Placement and Attach of Solder Balls to Wafers, Flip Chips and all BGA Packages, Richard Ramos.
Design Guidelines for Surface Mount and Fine Pitch Technology, Second Edition, Vern Solberg, Electronic Packaging and Interconnection Series.

* cited by examiner

*Primary Examiner*—Carl J. Arbes
*Assistant Examiner*—Minh Trinh
(74) *Attorney, Agent, or Firm*—Lerner, David, Littenberg, Krumholz & Mentlik, LLP

(57) ABSTRACT

A Microelectronic Bonding processes wherein a microelectronic element is connected with a connection component having a polymeric body, and a bonding material is provided between contacts on the microelectronic element and conductive features of the connection component. The microelectronic element is heated so as to activate the bonding material, and then cooled, leaving said contacts on said microelectronic element bonded to said conductive features on the connection component. The connection component is maintained at an average temperature below the glass transition temperature of the polymer in the connection component during the heating and cooling steps.

13 Claims, 10 Drawing Sheets

MICROELECTRONIC JOINING PROCESSES

CROSS REFERENCE TO RELATED APPLICATIONS

The present application claims benefit of U.S. Provisional Patent Application No. 60/123,602, filed Mar. 10, 1999, the disclosure of which is hereby incorporated by reference herein, and also claims benefit of U.S. Provisional Patent Application No. 60/148,612, filed Aug. 12, 1999, the disclosure of which is hereby incorporated by reference herein.

BACKGROUND OF THE INVENTION

Microelectronic elements such as packaged or bare semiconductor chips, discrete components and other elements are mounted to components such as rigid or flexible circuit panels by many different processes. For example, in a so-called "flip chip" or "C4" technique, a bare semiconductive chip is mounted to a circuit panel by disposing solder balls onto contact pads of the chip or circuit panel. The chip is then mounted with its front or contact-bearing surface facing downwardly, toward the first surface of the circuit panel and with the contact pads of the chip aligned with the contact pads of the circuit panel. The assembly is then heated to melt or "reflow" the solder whereupon the assembly is cooled leaving solid solder masses connecting each contact pad of the chip with the corresponding contact pad on the circuit panel.

As described, for example, in Multi-Chip Module Technologies and Alternatives; the Basics (Doame and Franzon, eds., 1993, pp. 450–476), considerable effort has been devoted in the art to development of the flip chip technique. Nonetheless, the flip chip technique typically requires large solder balls to provide solder joints having the strength and fatigue resistance needed to accommodate differential expansion and contraction of the chip and the circuit panel caused by temperature changes during service and/or manufacture. Thus, the flip chip technique typically requires contact pads having large center to center spacings or "pitch." For these and other reasons, use of the flip chip technique has been limited.

As described, for example, in certain embodiments of commonly assigned U.S. Pat. Nos. 5,148,265, 5,148,266 and 5,915,752, the disclosures of which are hereby incorporated by reference herein, microelectronic components such as semiconductor chips may be connected to components referred to as "interposers" such as flexible dielectric elements having terminals thereon. These connections desirably are made so that the terminals on the connection components remain movable with respect to the chip. A layer of a compliant material as for example, a gel or an elastomer may be provided between the interposer and the microelectronic element. These terminals can then be bonded to contact pads of a larger substrate such as a larger circuit panel. Because the terminals of the interposer remain movable with respect to the chip differential expansion in use does not impose substantial stresses on the connections between the terminals and the substrate.

As described in certain preferred embodiments of U.S. Pat. No. 5,518,964, the disclosure of which is hereby incorporated by reference herein, numerous connections can be made between a microelectronic element and a component such as an interposer by providing leads on the connection component so that one end of each lead is permanently attached to the component whereas another end is releasably attached; juxtaposing the component with a microelectronic element such as a chip or wafer and bonding the tip ends of the leads to the contacts on the microelectronic element. The microelectronic element and interposer are then moved away from one another, typically through a predetermined distance, so as to deform the lead towards vertically extensive disposition. In certain other embodiments taught in the '964 patent, the leads are provided on the microelectronic element rather than on the interposer.

In many of the processes disclosed in the aforesaid patents, an encapsulant is injected around the leads. For example, as taught in certain embodiments of the '964 patent, such an encapsulant may be injected between the interposer and the microelectronic element during or after the movement step so as to form a compliant layer there between surrounding the leads. As described, for example, in commonly assigned U.S. Pat. Nos. 5,706,174 and 5,659,952, the disclosures of which are also incorporated by referent herein, a compliant layer may be formed by providing a porous resilient layer such as a set of compliant standoffs between the connection component and the microelectronic element and connecting the contact pads of the microelectronic element to leads or other conductive features on the connection component. Typically after these connections have been made, a flowable material such as a curable encapsulant is introduced into the porous layer as, for example, between the compliant standoffs and cured so that the flowable material and the original porous layer form a composite complaint layer. The flowable material desirably also encapsulates the electrical connections.

U.S. Pat. No. 5,798,286, the disclosure of which is also incorporated by reference herein describes, in certain embodiments, techniques wherein a plurality of individual semiconductor chips or other separately formed microelectronic elements are assembled to a single connection component or interposer, as, for example, a dielectric sheet having leads thereon with releasable tip ends as discussed above with respect to the '964 patent. In certain disclosed embodiments of the '286 patent, the individual chips are held in a heated chuck and engaged with the tip ends of the leads so that bonding materials such as eutectic bonding alloys, solders or the like carried on the chip or on the leads are activated to form bonds between the chip and the leads. As also disclosed in certain embodiments of the '286 patent, and in certain embodiments of commonly assigned U.S. Pat. No. 5,766,987, the disclosure of which is hereby incorporated by reference herein, a covering layer may be provided over the rear surfaces of the chips so as to protect the rear surfaces of the chips from encapsulant contamination during the process.

The processes provided by the aforementioned patents provide substantial improvements in the art. Nonetheless, even further improvement would be desirable. For example, the heat applied during a bonding process may cause polymeric layers incorporated in components such as interposers to expand, making it more difficult to achieve precise alignment between the conductive features of the microelectronic elements and the conductive features of the connection component. Certain bonding materials, particularly solders, require fluxes at the connections to make a sound joint. These fluxes can cause problems in service unless they are removed by a cleaning process, which adds cost to the process. Also, many of the techniques commonly used in dispensing solder onto parts to be assembled do not lend themselves to extremely fine-pitch assembly work. Therefore, further improvements in bonding processes and in processes for applying bonding materials such as solders would be desirable.

SUMMARY OF THE INVENTION

One aspect of the present invention provides improved processes for making electrically conductive bonds between microelectronic components. In preferred processes according to this aspect of the invention, bonds such as solder joints are formed between contacts on a first microelectronic element such as a semiconductor chip or wafer and conductive elements of a second microelectronic element such as a connection component, by momentarily heating the first microelectronic element so as to activate a bonding material and then allowing the first microelectronic element to cool, leaving the contacts on the first microelectronic element bonded to conductive features on the second element or connection component. In preferred processes according to this aspect of the invention, the second element or connection component is maintained at an average temperature below the average temperature of the first microelectronic element during the momentary heating step. Stated another way, the temporary heating steps is performed so that the bonds are formed while the first microelectronic element is at a higher temperature than the second element or connection component. The microelectronic elements are not in thermal equilibrium with one another. Most preferably, where the second element or connection component includes a body formed wholly or partially from a polymer, the second element is maintained at an average temperature below the glass transition temperature of the polymer. This markedly reduces dimensional changes in the polymeric body.

Most desirably, the temporary heating and cooling steps are performed while the elements are maintained under a vacuum, i.e., a subatmospheric total pressure from most typically about 10–50 milliTorr. The vacuum inhibits heat transfer between the microelectronic elements. The first microelectronic element desirably is heated by directing radiant energy onto it. For example, where the first microelectronic element is a wafer or chip having a back surface facing away from the second microelectronic element or connection component, radiant energy such as infrared radiation in a wavelength band absorbed by the material of the chip or wafer can be directed unto the back surface. This heats the wafer rapidly.

A further aspect of the present invention provides methods of applying bonding material such as solder to form bonding material masses or "bumps" on a microelectronic element such as a chip or a wafer. In preferred methods according this aspect of the invention, the element has a non-wettable surface surrounding the contacts, i.e., a surface which cannot be wetted by the bonding material. The bonding material is applied in liquid form onto the element, such as on the contact bearing front face of the chip or wafer, so that the surface as a whole, including both the contacts and the non-wettable surface, is exposed to the liquid bonding material. The liquid bonding material adheres only to the contacts. The liquid bonding material forms small droplets having the natural shape of a meniscus due to surface tension. As further explained below, these droplets may have a very small volume. For example, the volume of such droplets may be substantially smaller than the volume of a spherical solder ball having a diameter equal to the diameter of the contact. Small solder masses, such as the meniscus-shaped solder masses, greatly reduce the probability of shorting between adjacent contacts during a bonding operation. They are particularly valuable with small contacts as, for example, contacts having diameters less than about 100 microns and/or contacts spaced at center to center distances or "pitch" less than about 200 microns.

A further aspect of the present invention provides a method of preparing a microelectronic element including the step of providing a microelectronic element having a plurality of contacts arranged in one or more rows, the contacts in each row being spaced apart from one another in a row direction. The method further includes applying a liquifiable bonding material as, for example, a solder paste to the element in elongated strips extending across the contacts transverse to the row direction. The lengthwise or elongation direction of each bonding material strip is transverse to the row direction. Desirably, the strips have widthwise dimensions in the row direction less than the dimensions of the contacts in the row direction. The method desirably includes the further step of bringing the bonding material to a liquid condition as, for example, by heating the bonding material. When the bonding material is in a liquid condition, it wets the contacts preferentially and does not substantially wet a surface of the microelectronic element surrounding the contact. Thus, surface tension in the liquid bonding material forms the bonding material in each strip into a mass covering the contact crossed by such strip. Applying the bonding material in the form of elongated strips transverse to the row direction provides spaces between the edges of adjacent bonding material strips substantially greater than the spaces between adjacent edges of the contacts in the row. Also, the spaces between edges of adjacent bonding material strips is greater than the spacing which would exist between adjacent edges of bonding material masses if the bonding material were applied in the form of a circular or square blob. This large spacing between bonding material masses prior to liquefaction allows application of the bonding material by techniques having limited precision such as stenciling without causing adjacent boning material masses to touch one another. When the bonding masses are liquefied, they will be effectively confined to the areas encompassed by the individual contacts and will remain out of its contract with one another. This technique allows application of solder pastes and other liquifiable bonding materials on contact space at a fine pitch. It also allows formation of relatively small, meniscus-shaped solder masses as discussed above. In a variant of this approach, the liquifiable bonding material is applied is masses which touch individual contacts in the row but which have their centers of area offset from the row centerline. Alternate masses have centers offset in opposite directions from the row centerline. The masses may not include elongated strips. Here again, there are relatively large spaces between adjacent masses.

A further aspect of the present invention provides methods of making microelectronic assemblies. A method in accordance with this aspect of the invention desirably includes the steps of providing one or more microelectronic elements and one or more components with a deformable barrier such as a flexible sheet. These are provided so that conductive features of the microelectronic elements and components confront one another in a working space at least partially bounded by the deformable barrier. The method according to this aspect of the invention further includes the step of maintaining the partial pressure of oxygen below the partial pressure of oxygen providing in normal atmospheric air at atmospheric pressure, i.e., below about 160 Torr, and maintaining the working space under a total absolute pressure lower than the total absolute pressure prevailing outside of the working space. A pressure differential on the barrier urges the barrier into the working space and the barrier urges conductive features on the one or more microelectronic elements into engagement with conductive features on the one or more components. A bonding material such as solder is activated at the engaged conductive features. This activation occurs at least partially while the atmosphere within the working spaces maintained at the aforesaid low partial pressure of oxygen. Most preferably, the total absolute pressure within the working space is below normal atmospheric pressure, and the activation step is performed while ambient atmospheric conditions prevail outside the working space. The desired low partial pressure of oxygen can be achieved simply by withdrawing air from the working space to lower the total pressure or, more preferably, by first flushing the working space with a non-oxidizing gas and then bringing the working space to the desired subatmospheric total pressure. The step of activating a bonding material desirably includes momentarily heating the bonding material and the conductive features as, for example, by applying radiant energy.

As further discussed below, connection of the bonds under a low oxygen partial pressure facilitates bonding, and particularly solder bonding, without flux. Because the deformable barrier in conjunction with other components, encloses the working space, the process can be performed under normal ambient atmospheric conditions, outside of a vacuum or pressure chamber. For example, where the components and microelectronic elements are heated by application of radiant energy, this step can be performed outside of a vacuum chamber. Moreover, the mechanical action of the deformable barrier or film urging the conductive features together helps to assure reliable engagement and bonding even where the parts carrying the conductive features are out of plane or of an uneven thickness. The deformable barrier may be a film or other deformable element formed separately from the microelectronic elements and components. Alternatively, the component or components may serve as part of all of the deformable barrier. For example, where the component or components includes a flexible, sheet-like dielectric element carrying conductive features, the dielectric element itself may serve as the deformable barrier.

A related aspect of the invention provides additional methods of making microelectronic assemblies. A method according to this aspect of the invention includes the step of providing one or more microelectronic elements in a working space between a flexible film and one or more components so that a front face of each microelectronic element with conductive features exposed thereon confronts a front face of a component having conductive features exposed thereon such front face and so that a rear surface of each microelectronic element faces upwardly away from the one or more components and toward the film. The conductive features of the elements and components are aligned with one another. This aspect of the invention further includes the step of maintaining the working space under an absolute pressure less than the absolute pressure prevailing outside of the working space, so that the film urges the microelectronic elements downwardly against the components and thus biases the conductive features into engagement with one another. While this pressure differential is present radiant energy is directed into the working space, preferably through the film and onto the one or more microelectronic elements to thereby momentarily heat the engaged conductive features and activate a bonding material on the engaged conductive features so as to bond these features to one another. Here again, the step of maintaining the working space desirably includes maintaining the working space at a subatmospheric total pressure, and the step of directing radiant desirably is performed while the exterior of the film is exposed to ambient atmospheric pressure. Here again, because radiant energy exposure operation and hence bonding can be performed outside a vacuum chamber, the process can be performed at low cost, using simple equipment. Moreover, the components and microelectronic elements can be cooled rapidly when exposure to radiant energy is terminated.

Most preferably, the step of providing the microelectronic elements and components includes providing the one or more components on an upper surface of a fixture and the step of maintaining the working space at subatmospheric pressure includes sealing a peripheral region of the film to the one or more components or to the fixture and withdrawing gas from the working space.

The flexible film desirably is sealingly connected to the rear surface or surfaces of the one or more microelectronic elements. The method may further include the step of injecting a curable material between the flexible film and the one or more components so as to encapsulate the conductive features after bonding. Thus, the same flexible film which bounds the working space during the bonding step also serves to protect the rear surfaces of the microelectronic elements during the encapsulant injection step. The conductive features on the microelectronic elements, on the components or both, may include leads, and the method may further include the step of moving the microelectronic elements and components away from one another to thereby deform the leads. This step may occur, for example, concomitantly with encapsulant injection. Particularly preferred methods according to this aspect of the invention include the step of temporarily securing the microelectronic elements to the one or more components prior to activation of the bonding material as, for example, when the microelectronic elements are first placed onto the one or more components. The temporary attachment is detached during or after the bonding step as, for example, before or during the step of moving the components and microelectronic elements away from one another.

A further related aspect of the invention provides methods of making microelectronic assemblies including the step of temporarily securing one or more elements in place on one or more components by providing temporary securements extending between the microelectronic elements and components. The temporary connecting elements desirably adhere to the microelectronic elements and to the components. The method according to this aspect of the invention desirably further includes the step of connecting conductive features of the one or more microelectronic elements to conductive features of the one or more components and releasing the temporary securements during or after the connecting step. Typically, the conductive features are exposed on front faces of the one or more microelectronic elements and on first surfaces of the one or more components and the temporary securing step is performed so that the front faces of the microelectronic element or elements confront the first surfaces of the one or more components, so that the conductive features are aligned with one another and so that the temporary connecting elements extend between the confronting surfaces of the microelectronic elements and components. According to this aspect of the invention, microelectronic elements such as chips can be aligned with the components and bonded to under moderate conditions, desirably at normal ambient room temperature. This simplifies the task of placing the microelectronic elements accurately. Once the microelectronic elements are disposed in the correct positions relative to the components, flexible film as discussed above can be placed over the rear surfaces of the microelectronic elements without moving them, inasmuch the microelectronic elements are held in place by the temporary securement.

In some embodiments the temporary securements can be released by application of heat. For example, where an encapsulant is applied around the conductive features and brought to an elevated temperature, the temperature used to cure the encapsulant may be sufficient to release the temporary securement. Alternatively or additionally, momentary heating applied to bond the conductive features to one another may serve to release the temporary securements from adhesion or to destroy the temporary securements. The temporary securements typically include organic materials such as thermoplastics or other polymers which can be degraded by application of heat.

A further aspect of the invention provides components for use in making microelectronic assemblies, as, for example, in the processes discussed above. A component according to this aspect of the invention includes a dielectric body having conductive features exposed at a first surface and also includes one or more "dummy pads" exposed at the front surface. The dummy pads may be formed from conductive or dielectric material. The dummy pads have release portions which are releasably connected to the dielectric body. One or more masses of temporary securement material are provided on the release portions of the dummy pads. The temporary securement material may be an adhesive material or other material adapted to bond to a microelectronic element when the microelectronic element is disposed over the front surface of the dielectric body. As further discussed below, the dielectric body may have holes extending through it to the dummy pads and the release portions of the dummy pads may be disposed in registration with the holes. Anchor portions of the dummy pads extend beyond the holes and onto the dielectric body. In use, the release portions of the dummy pads may break away from the anchor portions of the dummy pads.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
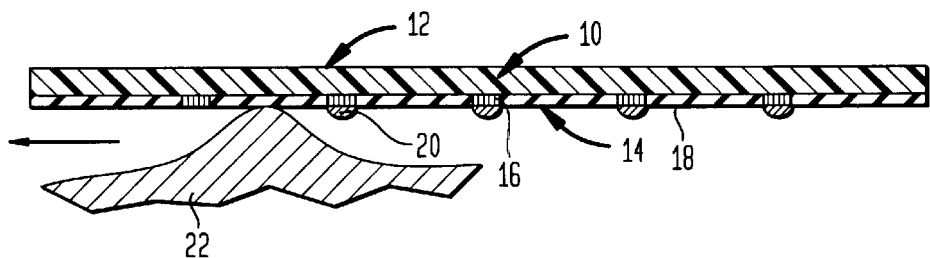
FIG. 1 is a diagrammatic sectional view depicting a microelectronic element during one stage of a process in accordance with one embodiment of the invention.

A process according to one illustrative embodiment of the invention begins with a semiconductor wafer 10 (FIG. 1) incorporating a large number of semiconductor chips in a single unit. Wafer 10 has a rear surface 12 and a front surface 14 with electrically conductive contacts 16 thereon. Contacts 16 are formed with a solder-wettable metal at their surfaces. For example, nickel, gold copper or combinations thereof can be provided at the contact surfaces. One typical arrangement provides aluminum contacts with nickel over the aluminum and gold over the nickel. Another typical arrangement provides chromium over an aluminum contact, copper over the chromium and gold over the copper. The front surface 14 also has a passivation layer 18 covering those areas not occupied by contacts 16. The passivation layer may be formed from a conventional silicon oxide, silicon nitride or other inorganic compound. Alternatively or additionally, the passivation layer may include polymeric materials such as polyimide. The thickness of the contacts and the passivation layer in the vertical directions, normal to the front and rear surfaces of the wafer are greatly exaggerated in FIG. 1 for clarity of illustration.

Figure 2:
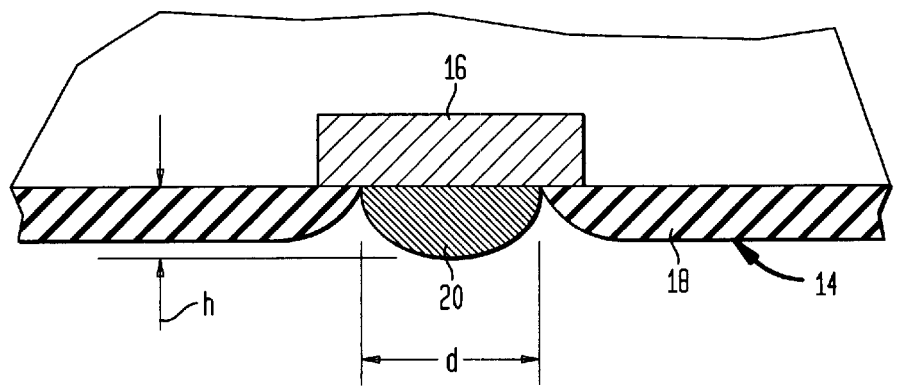
FIG. 2 is a fragmentary, diagrammatic sectional view on an enlarged scale depicting a portion of the component of FIG. 1.

Solder masses 20 are applied on contacts 16 by a wave soldering operation. As diagrammatically indicated in FIG. 1, the front surface 14 of wafer 10 faces down towards the top of a tank of molten solder 22. A wave is created in the solder by conventional equipment. Either the crest of the wave, the wafer or both move, so that the crest of the wave moves relative to the wafer, thereby contacting the entire front surface of the wafer. The molten solder contacts both the non-wettable passivation layer 18 and the wettable contacts 16 but adheres only to the contacts, thereby forming masses 20. As diagrammatically illustrated in FIG. 2, masses 20 are not spherical but instead have a flattened, dome-like shape caused by surface tension effects. Stated another way, each mass is in the shape of a meniscus. The exact shape of the meniscus will depend on factors such as the surface energies of the molten solder, the metal of the contacts 16 and the surrounding passivation layer. However, the outside diameter d of each solder mass 20 typically is equal to the diameter of the exposed area of the contact (the area not covered by passivation layer 18) whereas the height or vertical dimension h of each solder mass in the vertical direction, perpendicular to the front surface of the wafer typically is substantially smaller than the diameter of the mass. Each solder mass has a volume substantially smaller than the volume of a conventional spherical solder ball of equal diameter. Stated another way, the volume of each solder mass is less than $d^3/6$. In the use of solder masses formed on square or other non-round contacts, the diameter d can be taken as the mean horizontal dimension of the mass. The solder in the masses solidifies rapidly, by heat transfer to the wafer. The wafer may be cooled during application of the solder by a coolant or cold plate in contact with rear surface 12 to facilitate cooling of the solder and to limit the temperature attained within the wafer.

In the next stage of the process, wafer 10 is juxtaposed with a second microelectronic element or connection component 30. In the particular embodiment illustrated, component 30 includes flat, sheet-like body 32 having a top surface 34 and a bottom surface 36. In the illustration, body 32 is shown as a simple sheet of a polymeric material without any internal reinforcement or internal components. However, body 30 may include internal metallic components such as electrically conductive ground planes or traces, and may further include metallic or other components on its surfaces, such as electrically conductive traces extending along the surfaces. Body 32 is bonded to a rigid frame 38 defining a central opening 40 so that the body 32 extends across the central opening and so that the frame holds body 32 taut. The use of a frame to reinforce a flexible component such as a sheet-like element during processing and assembly operations is described in greater detail in U.S. Pat. No. 5,518,964 and also in co-pending, commonly assigned U.S. patent applications Ser. No. 09/173,797, filed Oct. 16, 1998 and Ser. No. 09/174,074, filed Oct. 16, 1998, the disclosures of which are hereby incorporated by reference herein.

Figure 3:
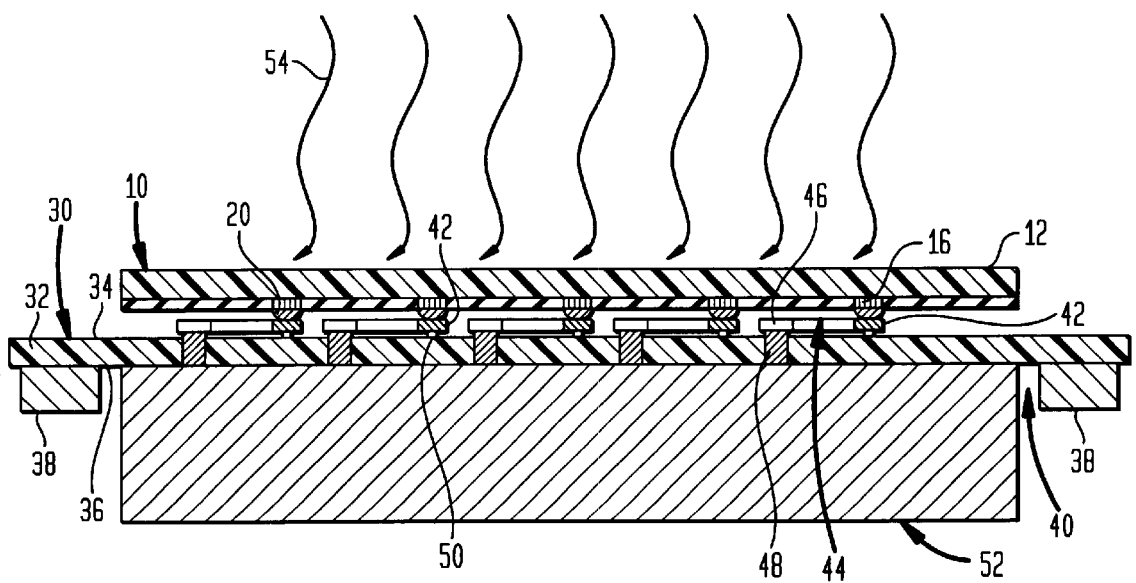
FIGS. 3 and 4 are diagrammatic sectional views depicting the component of FIGS. 1 and 2 during later stages of the same process.

The second microelectronic element or connection component has electrically conductive bonding features 42 overlying top surface 34. In the particular embodiment illustrated, each such bonding feature is formed as a tip end of a lead 44. Each lead 44 has terminal end 46 fixedly connected to body 32. For example, the terminal ends 46 are depicted in FIG. 3 as being attached to vias 48 extending through body 32 and forming terminals exposed at the second or bottom surface 36 of the connection component body 32. However, the terminal ends 46 may be anchored to the body in other ways. The tip ends or conductive connecting features 42 are connected to the top surface 34 of body 32 by small connecting elements 50. Connecting elements 50 have cross-sectional dimensions, in horizontal directions parallel to the top surface 34, smaller than the corresponding dimensions of conductive connecting features 42. These small connecting features serve to releasably attach the tip ends or conductive connecting features 42 to the top surface 34. The use of small features to form a releasable attachment between an end of a lead and a component is described in greater detail in the aforementioned '964 patent and also in co-pending commonly assigned U.S. patent application Ser. No. 09/020,750 filed Feb. 9, 1998; Ser. No. 09/195,371, filed Nov. 18, 1998, and in PCT International Application PCT/US99/02748, the disclosures of which are also incorporated by reference herein. As disclosed in the aforementioned patent and patent applications, the connecting elements may be formed from the metal used to form the electrically conductive components or else may be formed from the polymer defining top surface 34. The connecting elements may adhere weakly to the top surface or may be breakable. With either arrangement, the conductive features or tip ends 42 of the leads are releasably held to the top surface of connection component body 32.

The juxtaposed first microelectronic element or wafer 10 and second element or connection component 30 are placed in a vacuum chamber (not shown). The bottom surface 36 of the connection component body, facing away from the first element or wafer 10 is engaged with a temperature stabilizing block 52. Block 52 in turn is maintained at a pre-selected temperature, desirably below the glass transition temperature of the polymer in body 32 by appropriate temperature control devices such as a device for circulating a control-temperature fluid through the block or other conventional temperature control devices. For example, where the polymer is a polyimide having a glass transition temperature of about 300° C., the temperature of stabilizing element or block 52 desirably is between about room temperature (20° C.) and about 200° C., and should be below the glass transition temperature of the polymer. The connection component or second element 30 and the wafer or first element 10 come to thermal equilibrium at a temperature close to the temperature of stabilizing element 52. This equilibrium temperature is slightly below the solidus temperature of the solder in masses 20. The gas within the chamber is brought to a vacuum, i.e., a subatmospheric total pressure of about 1–50 milliTorr, more typically 10–50 milliTorr. The partial pressure of oxygen is less than the total pressure. To reduce the partial pressure of oxygen still further, the chamber may be flushed with a non-oxidizing gas before the vacuum is applied. Under these conditions, oxides and other metal compounds formed on the surfaces of solder masses 20 decomposed, leaving clean metal surfaces. The use of a high vacuum to cause decomposition of oxides on solder masses is described, for example, in an article entitled Flux Free Process for Placement and Attach of Solder Balls to Wafers, Flip Chips and All BGA Packages, by Richard Ramos, and the data sheet entitled Controlled Atmosphere Large Format Vacuum Furnace, model PF-2400, the disclosures of which are also incorporated by reference herein.

While the components are maintained under vacuum conditions, the first microelectronic element or wafer 10 is momentarily heated by applying radiant energy to the rear surface 12, as schematically indicated by arrows 54 in FIG. 3. Desirably, the radiant energy is in a band of wavelengths which is strongly absorbed by at least some of the components in the first element or wafer so that little of the radiant energy passes through the wafer to the second element or connection component 30. For example, the radiant energy may be applied by one or more halogen lamps or infrared lamps, typically disposed about 0–1 cm from the rear surface of the wafer. In one typical process, four lamps, each energized at 300 watts, are used to heat a 5 inch (12.7 cm) diameter wafer, so as to provide a power density of about 10 watts/cm$^2$. The lamps are energized at this power level for 120–180 sec. Greater or lesser power levels and heating times can be used. Alternatively the lamp or lamps may be continually energized and a shutter may disposed between the lamp and the rear surface of the wafer. The shutter may be opened, typically for about 120–180 sec and then rapidly closed. The pulse of applied infrared energy momentarily raises the temperature of the first element or wafer 10 to a peak temperature above the liquidus temperature of the solder in masses 20. The peak temperature attained is reasonably uniform throughout the wafer, inasmuch as the radiation is applied substantially uniformly over the rear surface of the wafer and the wafer is a reasonably good conductor of heat.

Heat conducted from the wafer and through contacts 16 and the surrounding portions of the wafer into solder masses 20 raises the temperature of the solder masses above their liquidus temperature. This also raises the temperature of the conductive features or tip ends 42 on the second element to a temperature at least sufficient to provide good interdiffusion between the solder and the metal of the conductive feature, i.e., a temperature sufficient to cause metallurgical bonding at the solder with the conductive features of the second element 30.

After the wafer 10 has been brought to its peak temperature, the temperature of the wafer rapidly declines due to heat transfer from the wafer. Such heat transfer can occur, for example, by radiation from the wafer to the surrounding surfaces of the vacuum chamber. As the temperature of the wafer momentarily rises and then falls back again towards its equilibrium temperature, the average temperature of the second element or connection component body 32 remains close to the temperature of the stabilizing element 52 and hence remains below the glass transition temperature of the polymer. That is, because there is very good heat transfer between the connection component body and the stabilizing element 52, and very poor heat transfer between the first element 10 and the body 32 of second element 30, the average temperature of the connection component remains substantially lower than the average temperature of the first element during the momentary rise and fall in the first element temperature. Because the average temperature of component body 32 remains below the glass transition temperature of the polymer, it does not undergo unpredictable dimensional changes, and hence the conductive features or tip ends 42 of the leads remain in a known, predictable positions. Although the momentary heating of the wafer may cause the wafer to expand slightly, this effect is readily predictable and relatively small compared to the dimensional changes which can occur in a polymeric element heated to above its glass transition temperature. Such predictable expansion can be compensated for in the design of the mating elements. When the wafer has cooled, the solder solidifies and forms bonds with the conductive features or tip ends 42 of the leads.

As pointed out above, there must be enough heat transfer into and through the solder masses so as to heat the solder masses 22 to their liquidus temperature and also heat the adjacent surfaces of the conductive features or tip ends 42 to a temperatures close to the temperature of the solder. However, heat transfer through the solder masses and other pathways should not raise the average temperature of the connection component or second element above the glass transition temperature of the polymer incorporated in that component. The vacuum environment greatly facilitates this operation, inasmuch as the vacuum substantially prevents convective heat transfer from the wafer 10 to the body 32 of the connection component or second element 30. Also, because each of the conductive elements 42 is connected to the body 32 by a relatively small connecting element 50, conductive heat transfer between the electrically conductive features or tip ends 42 and the body 32 is limited. Conversely, the relatively low height of solder masses 20 (FIG. 2) facilitates rapid heat transfer from the wafer through the solder masses to the surfaces of the conductive features or tip ends 42. All of these factors, taken together make it relatively easy to bring the solder masses and conductive features to a relatively high temperature while maintaining the body 32 at a relatively low temperature. It should be appreciated that some portions of body 32 immediately below the conductive features 42 may reach temperatures above the glass transition temperature of the polymer. However, the surrounding areas of the polymer remain dimensionally stable and hence localized heating in these regions does not materially affect dimensional stability of the part as a whole.

Figure 4:
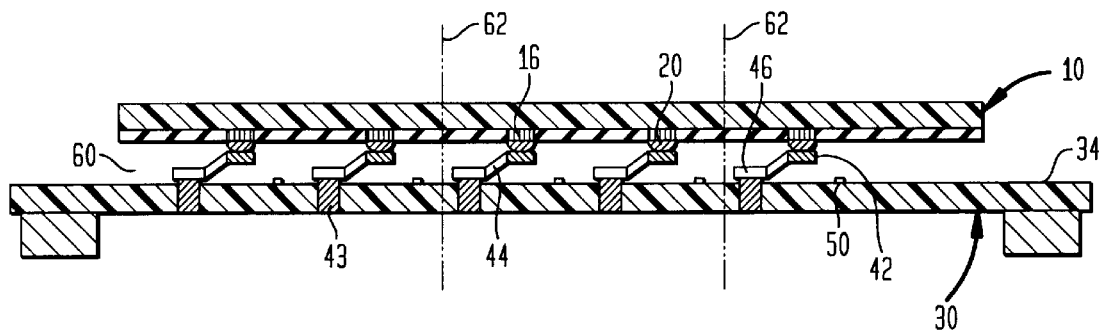

After forming the bonds, the elements 10 and 30 are moved away from one another so as to deform leads 44 towards a vertically extensive disposition 44' as seen in FIG. 4. This moves the conductive features or tip ends 42 away from the top surface 34 of the second element, and either breaks connecting elements 50 or peels them away from the conductive feature or the body surface. In the vertically extensive condition 44', the leads are flexible and allow movement of tip ends 42 relative to terminal ends 46 and relative to body 32. A curable liquid material such as a dielectric encapsulant 60 is injected between the elements during or after movement of the elements away from one another and cured to form a compliant dielectric layer. These steps can be accomplished in substantially the same way as described in the aforementioned patents and applications. The resulting product may be cut into individual units, each including one or more wafers and associated portions of connection component 30, by cutting the wafer and connection component along predetermined scribe lines 62. As described in greater detail in the aforementioned patents and publications, the resulting packaged semiconductor chip can be mounted to a circuit board or other device. The terminals 48 may be bonded to the circuit board. Differences in thermal expansion and other factors may cause movement of terminals 48 with respect to contact 16 on the chip in the service or during manufacture as, for example, during the heating and cooling associated with mounting to a circuit board. However, such differential movement is taken up by the flexible leads 44'. It does not cause appreciable stress on the solder masses 20. Stated another way, provision of a flexible or deformable connection to the solder masses allows the use of small solder masses. There is no need to provide a solder mass of sufficient dimensions to take up relative movement by deformation of the solder mass itself. Thus, the combination of a deformable connection and a small solder mass provides unique benefits. The small solder masses facilitate the use of fine-pitch contacts, whereas the flexible connections to the solder masses help the small solder masses to survive in service where such solder masses would otherwise be inadequate.

Figure 5:
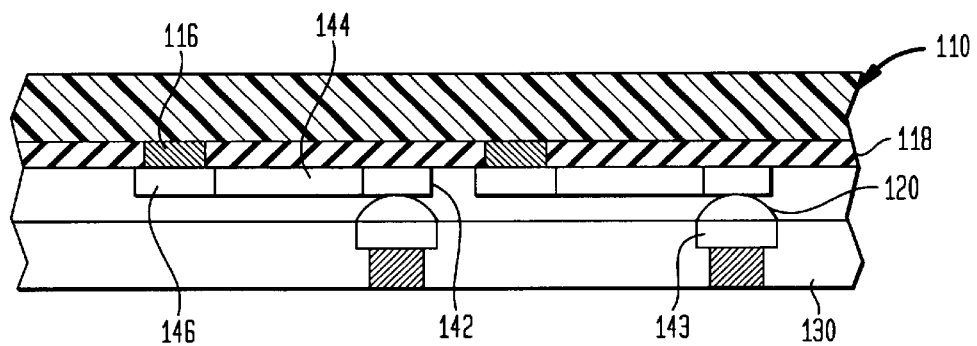
FIG. 5 is a fragmentary, diagrammatic sectional view depicting components during a process in accordance with a further embodiment of the invention.

Numerous variations and combinations of the features discussed above can be utilized. For example, the designations "top" and "bottom" are used merely for convenience of reference. The entire arrangement can be provided in any position relative to the normal, gravitational frame of reference, so that, for example, bottom surface 36 may face upwardly in the gravitational frame of reference. Also, the arrangement of leads and conductive features can be reversed so that the wafer or chip 110 (FIG. 5) is provided with leads 144 having fixed or terminal ends 146 permanently bonded to contacts 116 of the wafer and having tip or releasable ends 142 releasably connected to the surface of the wafer, as for example, by a low adhesion bond between the tip ends 142 and the passivation layer 118. Further, the solder masses may be provided on the connection component, rather than on the wafer. In FIG. 5, the connection component 130 has fixed conductive features 143 provided with solder masses 120 in the manner discussed above with reference to the wafer.

Also, other ways of momentarily heating a component can be used apart from radiant energy. For example, the rear surface of the wafer may be exposed momentarily to a hot heat transfer fluid such as a liquid or a hot gas. If desired, such exposure can be followed by prompt exposure to a cold heat transfer fluid. Appropriate precautions should be taken to avoid contaminating the components with any such heat transfer fluids. Also, where radiant energy is employed, radiant energy may be directed onto the first element or wafer through the second element, provided that the radiant energy is not strongly absorbed by the second element. This arrangement is less preferred inasmuch as it imposes constraints on the design of the second element. For example, this arrangement cannot be used readily where the second element contains a large amount of metal in the form of ground planes or the like. Further, although the process has been described with reference to forming bonds between wafers and connection components, the same process can be used with other microelectronic elements. Merely by way of example, the process can be used to form connections between two wafers; between two chips; or between two connection components.

Figure 6:
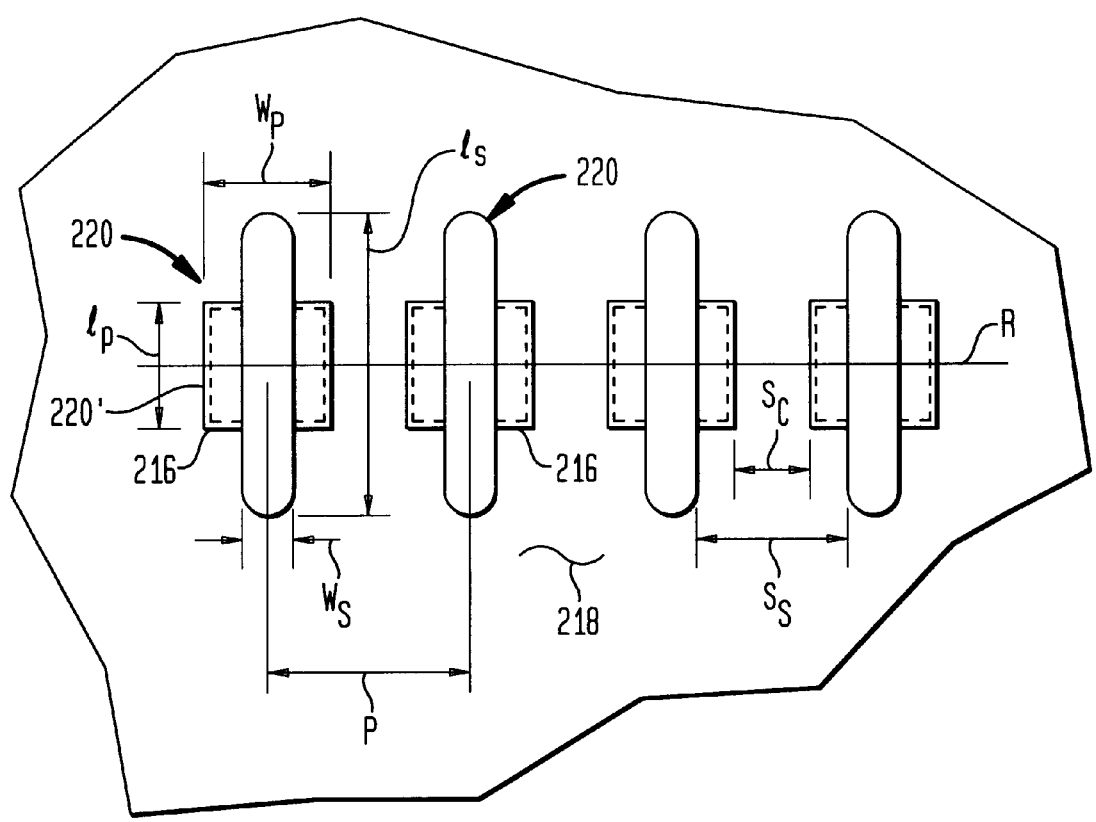
FIG. 6 is a fragmentary, diagrammatic plan view depicting portions of a component during a process in accordance with a further embodiment of the invention.

As illustrated in FIG. 6, a microelectronic element, such as a wafer, connection component or the like may have numerous contacts 216 arranged in rows. Each row of contacts a whole extends in a row direction, and the contacts are spaced apart from one another in the row direction (to the left and right), along line R as seen in FIG. 6). Although only one row is shown in FIG. 6, the actual component may include one row or plural rows having the same row directions or different row directions. The contacts are surrounded by a surface 218 which is substantially non-wettable by the molten bonding material. Portions of this surface extend between adjacent contacts 216. Surface 218 is substantially less wettable by the molten bonding material than the surfaces of the contacts 216. This surface 218 may be a typical passivation-layer surface such as a layer of silicon oxide, silicon nitride or a polymeric material such as polyimide, whereas the surfaces of contacts 216 may be formed from a solder-wettable material such as gold, copper or combinations thereof. It is desirable to make the pitch or center-to-center distance as small as practicable consistent with good bonding and good reliability during service.

In a method according to a further embodiment of the invention, solder is applied to the contacts by stenciling, silk-screening or otherwise depositing elongated strips 220 of solder paste. Each strip 220 extends across a contact 216. The direction of elongation of each individual strip is transverse to the row direction. Each strip has a width-wise dimension $w_s$ smaller than the dimension $w_p$ of the pad in the row direction. Thus, the edge to edge spacing $S_s$ between adjacent strips 220 is greater than the edge to edge spacing $S_c$ between adjacent contact pads. Each strip 220 desirably extends across the associated pad 216 near the center of the contact.

Solder pastes are mixtures of a paste constituent, which may include a flux, together with finely powdered metal solder. The solder paste typically also include a solvent with or without additives such as thickening agents for control of viscosity. A solder paste may have a liquid or pasty consistency when first applied and may set to a firmer consistency by evaporation of the solvent after application. Solder pastes typically are applied by stenciling, silk screening or application of through a fine dispensing needle. Upon heating, the solder in the case melts and the flux and other outraging components react or evaporate, leaving a liquid metallic solder. Conventional solder paste application processes are discussed, for example, in Solberg, *Design Guidelines for Surface Mount and Fine-Pitch Technology, Second Edition*, pp. 218–226, *McGraw-Hill*, 1996, the disclosure of which is hereby incorporated by reference herein. Solder paste typically is applied with the component at about room temperature, i.e., at temperatures well below the melting point of the solder. The solder paste, with its metal particles dispersed in an organic phase, wets the surface of layer 218 as well as the surface contacts 216 and hence remains in the as-deposited strip-like form extending over both the contacts and the adjacent portions of surface 218.

In the next stage of the process, the component 220, with the solder paste strips thereon, is heated to a temperature above the solidus temperature of the metal in the solder paste and desirably above the liquidus temperature of the metal. The organic components evaporate or separate from the molten metal, leaving a mass of molten metal corresponding to each paste strip 220. The molten metal in each strip preferentially wets the surface of the associated contacts 216 and flows to form a mass atop the contact. Stated another way, surface tension and interfacial tension reshape the molten solder from the strip shape of the originally-applied paste to the shape 220' corresponding to the shape of the associated contact 216.

Processes according to this aspect of the invention can be applied to contacts of any size and shape. However, they are especially valuable in the case of contacts having a close pitch, i.e., having a pitch or center-to-center distance P below about 250 microns and typically below about 200 microns. Typically, each contact has a width-wise dimension $w_p$ between about 70 and 100 microns. In the case of round contacts, the width-wide dimension is simply the diameter of the contacts. The length of $l_s$ of each strip desirably is greater than 1.0 times the dimension $l_p$ of the contact pad in the direction parallel to the length of the strip. The upper limit on solder-paste strip length $l_s$ is set by surface tension considerations, this distance should not be so great that, upon heating the molten solder at the tips of the strip coalesces into separate droplets and is not pulled onto the contact pads. Typically, the strip width $w_s$ is less than or equal to the widthwise dimension $w_p$ of the contact.

Figure 7:
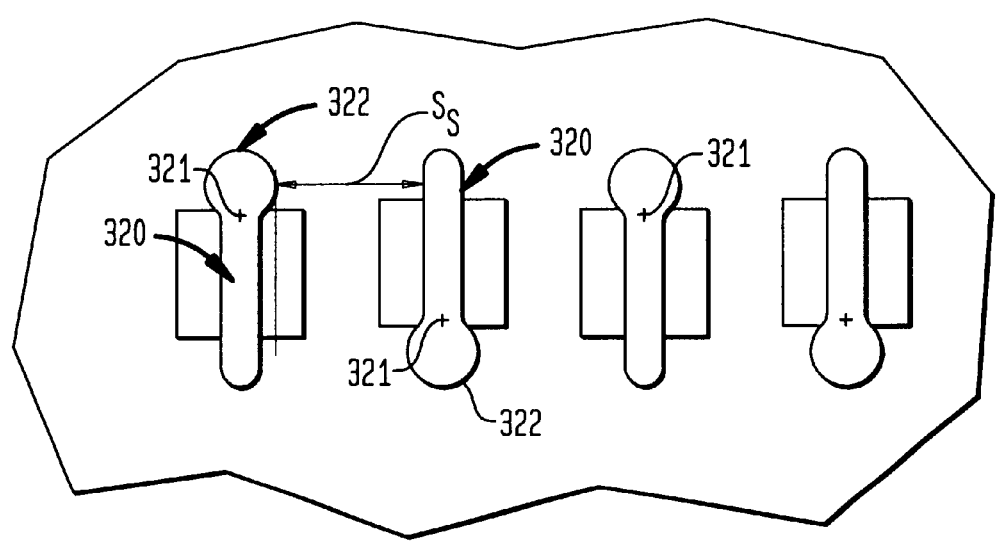
FIGS. 7, 8A and 8B are views similar to FIG. 6 but depicting components during processes in accordance with other embodiments of the invention.
Figure 8A:
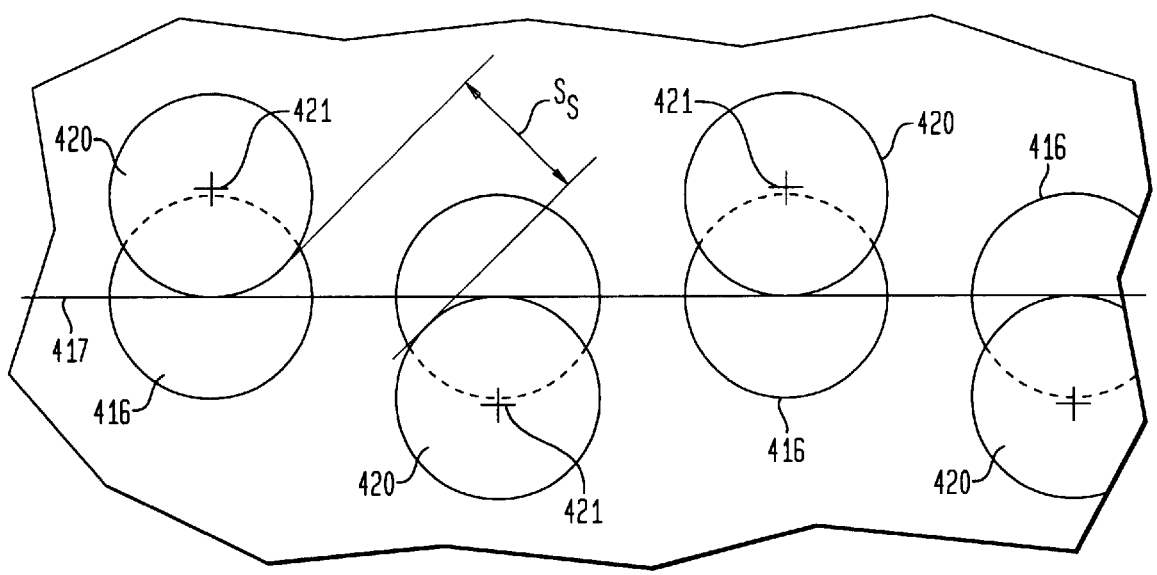

In the arrangement of FIG. 7, the solder paste or other bonding material is applied so as to form blobs 322 on one end of each strip 320. The blobs are arranged so that the blobs on alternate strips are disposed on opposite sides of the row as pads. This provides more solder in a strip having a given length $l_s$. Because the blobs are disposed on opposite sides of the row, this arrangement does not materially reduce the edge to edge spacing $S_s$ between adjacent solder strips. In a further variant, (FIG. 8A) the solder masses 320 are not in the form of elongated strips. However, each solder mass is applied so that the center of area 421 of the solder mass 420 is offset from the row centerlines 417. The centers of area 421 of adjacent solder masses 420 along the row are offset from the row centerline in opposite directions. Here again, the edge to edge spacing of $S_s$ between adjacent solder masses is greater than that which would be achieved by solder masses having sizes shapes and placement conforming to the shapes of the contact pads 416. Many different shapes of contact pads and solder masses can be used. For example, square, triangular or other contact pad shapes may be employed at a square, triangular, or other solder mass shapes. The arrangement of FIG. 7 discussed above also provides the solder masses with centers of area 321 offset from the centerline of the row on opposite sides thereof.

Figure 8B:
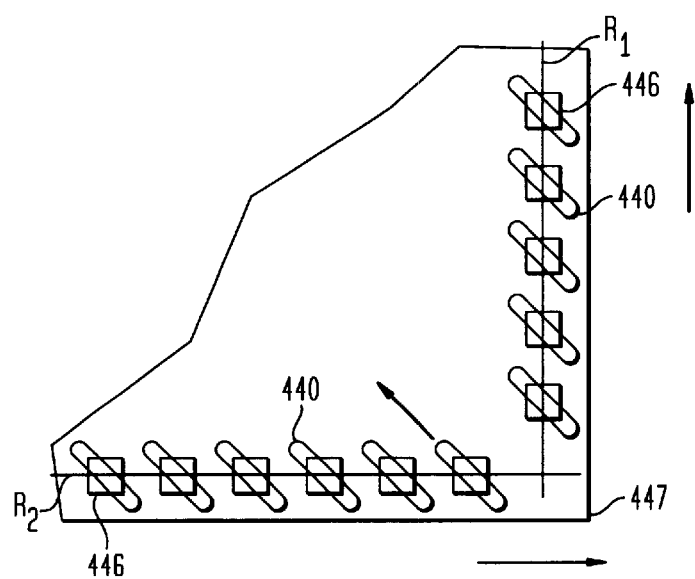

As seen in FIG. 8B, a chip or other element may have rows of contacts 446 extending in different row directions. Thus, the two rows of contacts partially shown in FIG. 8A extend in mutually orthogonal row directions $R_1$ and $R_2$, and approach one another at a corner 447 of the chip. The strips 440 of bonding material may be applied so that the strips crossing both rows of contacts extend in a common strip direction which is oblique to both row directions. For example, the direction of elongation of strips 440 may be at a 45° angle to both row directions. The use of a common strip direction makes it easier to apply the strips uniformly. Also, positioning of the strips in this manner avoids interference between strips at the corner.

A connection component 530 (FIGS. 9 and 10) utilized in a process according to a further embodiment of the invention includes a dielectric body 532 having conductive features in the form of leads 544 on a first or top surface 533. In this embodiment as well, the leads incorporate tips ends 545 releasably attached to the body 530 and terminal ends 546 permanently secured to the dielectric body by terminal structures 548. Component 530 also includes temporary attachment elements or securements 502. Each temporary securement element includes a "dummy" pad having a release portion 506 in the center of the pad and a attachment portion or anchor portion 508 extending around the periphery of the pad. Holes 510 are provided within body 532 in alignment with the dummy pads, so that the release portion 506 is aligned with the hole 510 whereas the anchor portion 508 extends beyond the peripherally of the hole and is engaged with the dielectric body 532. Each temporary securement 502 also includes a mass of an adhesive 512 disposed atop the release portion 506 of the dummy pad.

Adhesive 512 desirably is adapted to form adhesive bonds to the surface of a microelectronic element, which will be used with the component. For example, where the microelectronic element is to be united with a component incorporating passivation layers on its front surfaces, the adhesive 512 preferably is adapted to form an adhesive bond to the passivation layer. The adhesive desirably is arranged to form these bonds at or near room temperature such as below about 100° C. and preferably below about 60° C., and under ordinary atmospheric conditions. As further discussed below, the adhesive used in the securement 502 need not provide a reliable adhesive bond under conditions encountered in service. Essentially any adhesive which is capable of forming a bond of sufficient strength to hold the microelectronic component in position during the steps prior to formation of electrical connections as discussed below, and which does not contaminate the assembly can be employed. For example, epoxies, acrylics and even conventional household glue of the type sold under the registered trademark Elmer's Glue-All can be employed. Where the adhesive tends to cure or "set" after application, the adhesive can be applied shortly before the component is used.

In a process according to a further embodiment of the invention, microelectronic elements such as semiconductor chips 510 are united with component 530. The microelectronic elements or chips have rear surfaces 512 and front surfaces 514 with contacts 516 (FIG. 10) thereon. The microelectronic elements also have a passivation layer 518 covering those regions of the front surface 514 not occupied by contacts 516. Here again, the microelectronic elements bear solder masses 520 on their contact 516. These solder masses may be applied by any of the processes discussed above as, for example, by wave soldering as discussed above with reference to FIG. 1 or by paste application as discussed above with reference to FIGS. 6–8, or by conventional processes. The microelectronic elements are placed onto the connection component 530 at or near room temperature, under normal atmospheric conditions using conventional pick and place equipment equipped with conventional robot vision systems. Under the control of the robot vision equipment, each microelectronic element is aligned with component 530 So that the contacts 516 and the solder masses 520 thereon are aligned with the conductive features of the component. However, the temperature at this stage of the process is too low to activate the electrically conductive bonding material or solder 520 aligned with the conductive features. Instead, each element 510 is held in position temporarily by the temporary connecting elements 502 and by the adhesive bond 512. The ability to place the microelectronic elements onto component 530 at or near room temperature and under standard atmospheric conditions greatly facilitates placement of the microelectronic elements onto the component. For example, because the polymeric material in dielectric body 532 is maintained below its glass transition temperature during this step, the dielectric material remains dimensionally stable. Also, there is no need to operate the robotic vision and placement system within an environmental chamber. The size of solder masses 520 is greatly exaggerated in FIG. 9, and in the succeeding figures for clarity of illustration.

Figure 11:
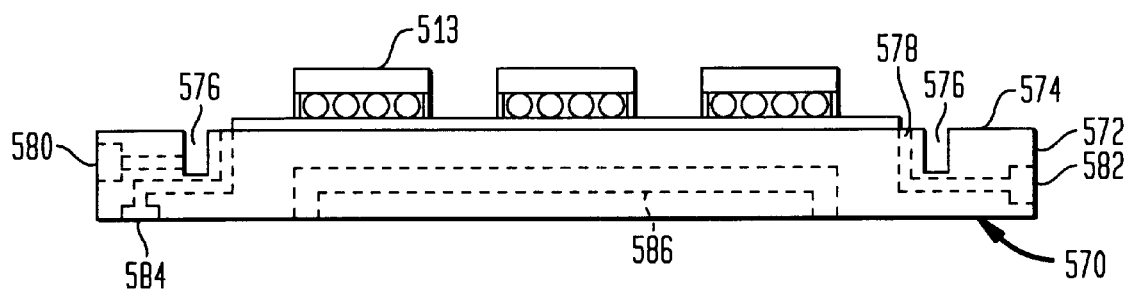
FIGS. 11, 12, 13, 14 and 15 are further diagrammatic elevational views depicting the components of FIGS. 9–10 during progressively later stages of the process.

The component 530 with the microelectronic elements thereon is placed onto a fixture 570 (FIG. 11). The fixture includes a metallic plate 572 having a top surface 574 and a groove 576 extending around a central region 578 of the top surface. Groove 576 is open to the top surface. The fixture also has one or more vacuum ports 580 communicating with groove 576. One or more additional ports 582 and 584 also may be provided. Additional ports 582 and 584 communicate with the central region 578 of the top surface through internal channels within plate 572. Desirably, the fixture, the ancillary equipment (not shown) used with the fixture, both include some arrangement for controlling the temperature of plate 572. For example, plate 572 may be provided with an internal channel 586 for conducting a temperature control fluid through the plate. Other temperature control arrangements which may be used include electrical resistance and/or thermoelectric heaters; thermoelectric cooling devices and other conventional heating or cooling devices. Desirably, these devices are equipped with appropriate feedback control systems for maintaining the desired plate temperature. The fixture are similar to the fixtures described in co-pending, commonly assigned U.S. patent application Ser. No. 09/174,074 filed Oct. 16, 1998, the disclosure of which is hereby incorporated by reference herein.

After the microelectronic elements 510 and component 530 are in place on fixture 570 a deformable barrier in the form of a flexible film 590 is disposed over the rear surfaces 512 of the microelectronic elements and over fixture 570. Film 590 may or may not form a part of the completed microelectronic assembly as discussed below. In those applications where the film does not form a part of the completed device, the film may be formed from essentially any material which is capable of withstanding the temperatures and pressures encountered in the assembly operation. For example, films formed from polyamide, fluoro polymers and the like may be employed. The firm desirably is transparent or translucent to radiant energy used in the process. However, even if a polymer has appreciable absorptivity for infrared radiation or other radiant energy used in the process, a relatively thin film of such a polymer may have a relatively small absorption and hence may be useful in the process.

Figure 12:
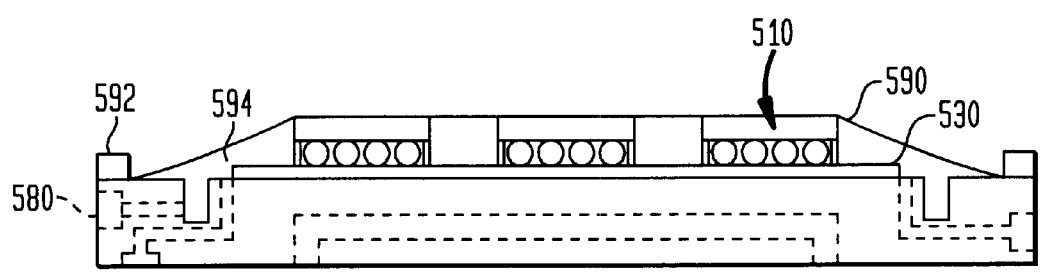

Film 590 may be clamped against the top surface of the fixture by a clamping ring 592 (FIG. 12) disposed outside of channel 576. The space between the film 590 and the fixture preferably is flushed with a gas that is substantially non-oxidizing to the bonding material and other elements during the bonding process as, for example, nitrogen, carbon dioxide, argon or helium. After gas flushing, gas is withdrawn through port 580, and may also be withdrawn through one or more of auxiliary ports 582 and 584. These ports may be connected to a conventional vacuum pump for this purpose. This brings the working space 594 between film 590 and component 530 to a subatmospheric total pressure. Also, at this time the partial pressure of oxygen within working space 594 is substantially lower than the partial pressure of oxygen in normal atmospheric air, i.e., below about 160 Torr. This low partial pressure of oxygen is due to two factors: the low total gas pressure and the low proportion of oxygen in the residual gas present in working space 594.

Figure 13:
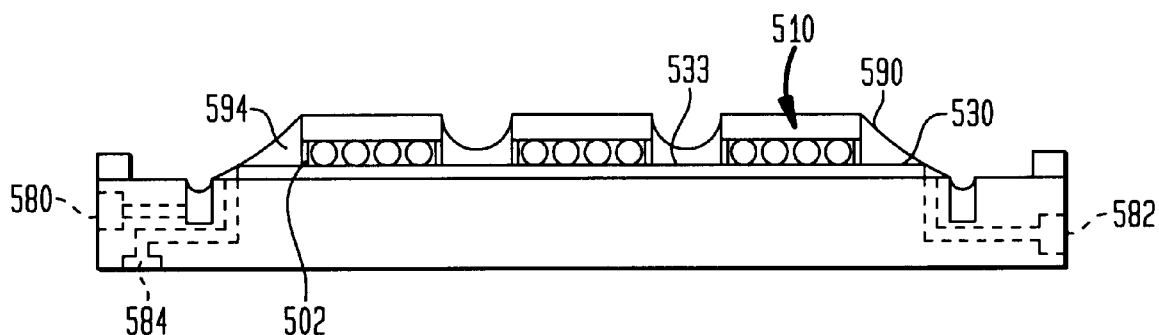

The surrounding atmosphere bears on the exterior surface of the barrier or film 590. Because the atmospheric pressure is higher than the pressure within working space 594, there is a pressure differential across the barrier or film 590 urging the barrier or firm towards component 530. The barrier or film thus urges the microelectronic elements 510 towards the component and hence urges the electrically conductive features, such as the contact 516 on the microelectronic elements (FIG. 10) towards the corresponding leads or other conductive features 544 on the component 530. The barrier or film may distort as shown in FIG. 13.

Figure 9:
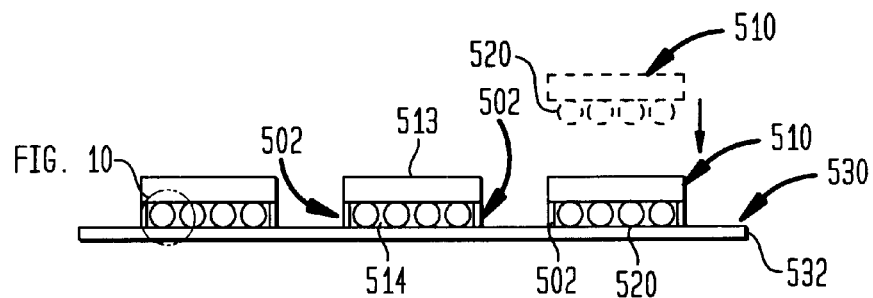
FIG. 9 is a diagrammatic elevational view depicting portions of components during a process in accordance with a further embodiment of the invention.
Figure 10:
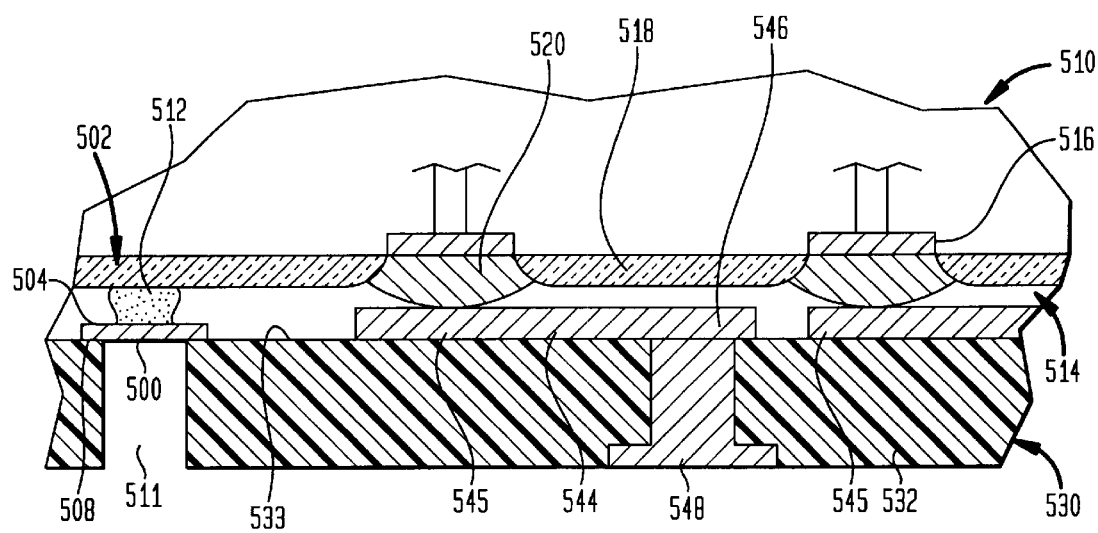
FIG. 10 is a fragmentary, diagrammatic view on an enlarged scale depicting the area indicated in FIG. 8.

Although the film applies substantial downward forces to the microelectronic elements, it does not apply substantial net forces to any of the semiconductor chips or microelectronic elements 510 in horizontal directions, parallel to the top surface 533 of component 530. Therefore, the individual semiconductor chips remain substantially in the positions where they are placed during the initial placement step (FIG. 9). The downward forces, however, assure good engagement between the conductive features on the microelectronic elements 510 and component 530, even where the microelectronic elements are slightly different thicknesses and/or where the microelectronic elements, the component or both are slightly out of planarity. Thus, the bonding material masses 520 on the conductive features 516 of elements 530 are forced into engagement with the tip ends 545 of leads 544. The temporary securements 502, and particularly the adhesive masses 512, can deform slightly in compression so as to allow some movement of chips or microelectronic elements 510 toward component 530.

During these stages of the process, the plate 572 constituting fixture 570 is maintained at a temperature below the glass transition temperature of the polymer constituting the body of component 530. Desirably, the fixture is maintained at a temperature slightly below the solidus temperature of the solder constituting the solder masses 520. Under these conditions, oxides and other compounds found on the surfaces of the solder masses and on the surfaces of the conductive features decompose, leaving clean metal surfaces in a manner similar to that discussed above. Depending on the composition of the adhesive 512 in securements 502, the temperature used in this operation may cause the adhesive to degrade. However, the secure engagement provided by the film will hold the chips in place.

Figure 14:
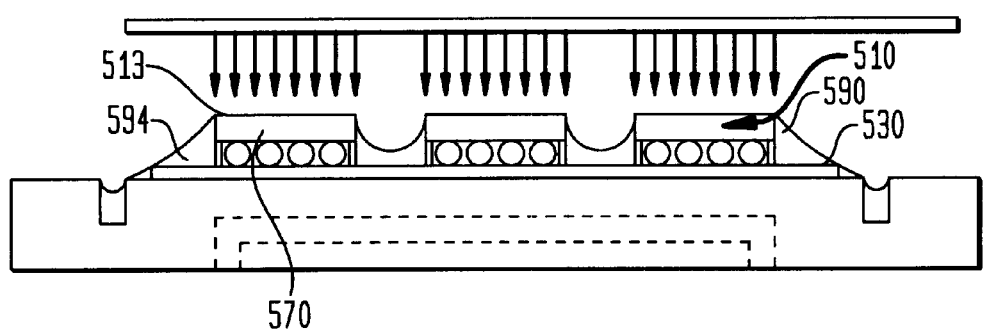

In the next stage of the process, while the total pressure within the working space 594 is maintained below atmospheric pressure, and while the partial pressure of oxygen is maintained below the partial pressure of oxygen in normal room air, the engaged conductive features 516 and 544 are heated momentarily by applying radiant energy to the rear surfaces of the microelectronic elements 510, through a barrier or film 590 as schematically depicted in FIG. 14. The radiant energy typically heats the conductive features by absorption of the radiant energy in the microelectronic element and conductive heat transfer from the microelectronic element to the contact pads 516, solder masses 520 and leads 544. Also, some of the radiant energy may pass through the microelectronic element and may be absorbed by component 530 adjacent to top surface 533 thereof. Here again however, the mean temperature of body 532 desirably is maintained below the glass transition temperature of the polymer constituting the body. As discussed above with reference to FIGS. 1–4, this helps to maintain the dimensional stability of the polymeric body. Here again, the intimate contact between the dielectric body 532 and fixture plate 572 promotes good heat transfer between the dielectric body and the fixture and helps to maintain the temperature of the dielectric body close to that of the fixture plate. Film 590 continues to urge the microelectronic elements or chips 510 downwardly, towards component 530 and hence continues to urge the conductive features into engagement with one another at this stage of the process.

The radiant energy application conditions can be similar to those discussed above with reference to FIGS. 1–4. However, the radiant energy application step of FIG. 14 can be conducted while normal atmospheric conditions prevail outside of working space 594. Stated another way, the film and fixture cooperatively form a small vacuum chamber enclosing the parts to be treated. Accordingly, there is no need to hold the fixture inside a separate controlled-environment chamber during the radiant energy application step. This greatly simplifies the process and facilitates the handling of numerous parts on a mass-production basis.

The applied radiant energy raises the solder above its solidus temperature and desirably above its liquidus temperature and causes formation of metallurgical bonds between conductive features on elements 510 and component 530. Thus, the contact pads 516 are bonded to the tip ends 545 of leads 544 by molten solder masses 520. During this step, the film or barrier continues to urge the microelectronic elements and component towards one another. Adhesive masses 512 (FIG. 10) may deform slightly or degrade during this process. These factors facilitate engagement of the molten solder masses with the conductive elements of component 530, i.e., with lead tip ends 545.

Upon termination of the radiant energy application, the conductive features, microelectronic element and component 530 cool rapidly. The presence of normal, atmospheric air on the film surface overlying the rear surfaces of microelectronic elements 510 facilitates cooling of these elements by conduction through film 590 and convention cooling into the surrounding atmosphere. Component 530 is cooled effectively by heat transfer to plate 572.

Figure 15:
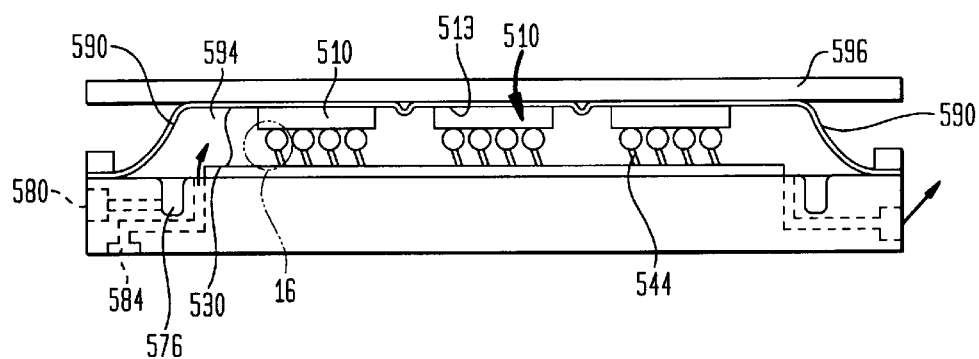
Figure 16:
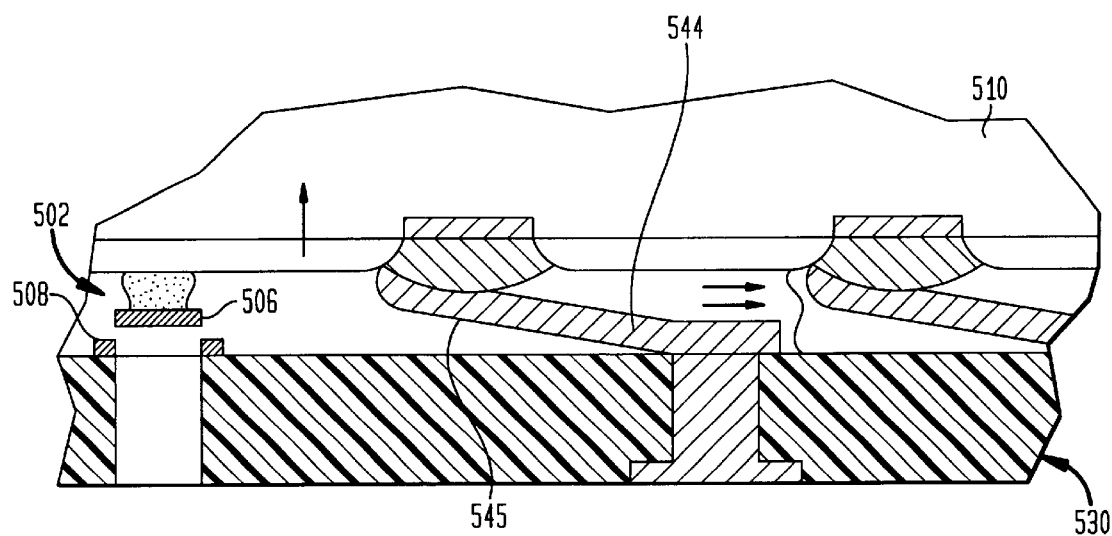
FIG. 16 is a fragmentary, diagrammatic view on an enlarged scale depicting the area indicated in FIG. 15.

After cooling, metallurgical bonds exist between contact pad 516 and lead tip ends 545. In the next stage of the process, a flowable, curable material such as a polymeric encapsulant forming composition is injected under pressure between component 530 and film 590 and hence between chips or microelectronic elements 510 and component 530. The vacuum present in working space 594 facilitates injection of the curable composition and assures that the curable composition can penetrate into all spaces present in the assembly as, for example, around leads 544 as schematically illustrated in FIG. 16. For example, the curable composition may be injected through one of the auxiliary ports 584. One or more ports communicating with working space 594 may be left connected to a vacuum source during the beginning portion of the injection cycle to facilitate removal of gases evolved from the encapsulant and to withdraw any remaining gas from the working space. However, these ports are desirably are closed before completion of the encapsulant injection so that the pressure within the flowable composition increases to an absolute pressure above normal atmospheric pressure, i.e., to a positive gauge pressure. Under these conditions, the encapsulant urges the film and the microelectronic elements 510 upwardly away from component 530 and causes the microelectronic elements 510 to move upwardly, away from component 530. If not previously broken, the temporary connections 502 break during this process. As best seen in FIG. 16, the release portions 506 of the dummy pads break away from the anchor portions 508, thereby allowing the chip or microelectronic element 510 to move upwardly away from component 530. As the microelectronic element moves upwardly away from component 530, the tips ends 545 of leads 544 are also moved upwardly, away from the body of component 530 thereby deforming the leads 544 towards a vertically extensive disposition. The size and vertical extent of leads 544 is greatly exaggerated in FIG. 15 for clarity of illustrations. In fact, a vertical displacement of about 50 to about 200 microns typically suffices. A platen 596 (FIG. 15) may be provided in engagement with the exterior surface of film or barrier 590 so as to control the vertical movement of the film and of the chips or microelectronic elements 510. In a further variant, the platen may be provided with vacuum passages (not shown) for engaging the film and hence holding the film and microelectronic elements against the platen. The platen and hence the microelectronic elements 510 may be moved relative to fixture 572 by an external movement device (not shown) so as to move the microelectronic element relative to component 530 independently of curable material injection. In a further variant, movement of the film 590 and microelectronic element may be produced by injecting a gas or inert liquid into working space 594. The resulting parts may be encapsulated at a later stage or left unencapsulated.

During injection and curing of the flowable encapsulant, film 590 protects the rear surfaces 512 of the chips, so that those surfaces remain free of encapsulant after curing. After injection and curing of the encapsulant, the parts are removed to form the fixture and the component 530 is severed so as to form individual assemblies, each including one or more of the microelectronic elements and portions of the component associated herewith and connected thereto by leads 544. Portions of film 590 remaining on the rear surface of each chip may be peeled away, to expose a clean surface 512 for connection to a heat sink. Alternatively, the film 590 may be peeled away before severing.

Figure 17:
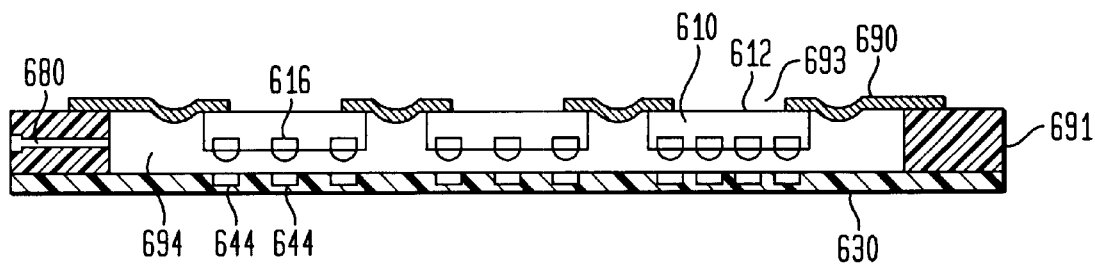
FIG. 17 is a diagrammatic sectional view depicting components in a process according to a further embodiment of the invention.

As shown in FIG. 17, the flexible barrier or film 690 may be sealed to component 630 directly or else by means of a sealing ring or frame 691 extending around the periphery of the component. Also, as seen in FIG. 17, the deformable barrier or film 690 need not be continuous but may have openings 693 aligned with the microelectronic elements 610, provided that the film 690 forms a seal to the microelectronic rear surface 612 at the periphery of each opening 693. As will be appreciated from FIG. 17, the film 690 forms a top sealing film whereas the component 630 itself forms a bottom sealing film. These films, cooperatively with frame 691 enclose the working space 694. Here again, a subatmospheric total pressure within working space 694 causes the surrounding atmospheric pressure to bear on the films and urge the conductive features 644 of the components 630 together with the conductive features 616 of the microelectronic components. As discussed in detail in co-pending, commonly U.S. patent application Ser. No. 09/067,698 filed Apr. 28, 1998, the disclosure of which is hereby incorporated by reference herein, a frame for forming a sealed unit used in semiconductor processing may be formed from a relatively inexpensive material such as a polymer so as to provide a disposable frame. As also disclosed in the '698 application, vacuum can be applied within the working space enclosed by such a frame and membrane assembly, and a fluid such as a curable encapsulant composition may be injected into such a space using needles penetrating a film. Alternatively or additionally, the frame may incorporate ports and connections. For example, where the frame 691 is produced by a process such as injection molding, passageways 680 may be molded into the frame so as to provide ports for gas flushing, vacuum application and encapsulant injection. These ports may be used in the same manner as the ports discussed above. As described in greater detail in the '682 application, the use of disposable frames essentially eliminates the task of cleaning fixtures so as to remove cured encapsulant. Typically, after the various steps of the process has been performed, the frame is cut into pieces when the components 630 is severed so as to form individual units as described above. The pieces of frame are removed and discarded.

Figure 18:
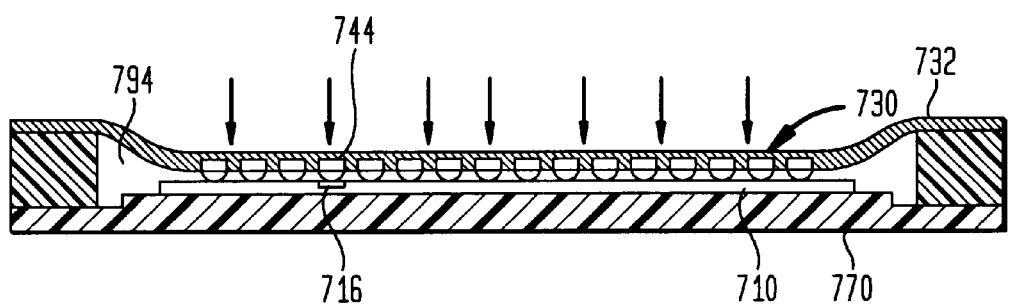
FIGS. 18 and 19 are views similar to FIG. 17 but depicting components in processes according to still further embodiments of the invention.

As seen in FIG. 18, the microelectronic element may include a wafer 710, whereas the component 730 may incorporate a flexible, dielectric film body 732. Film 732 may be sealed to the component 710, or preferably, to a fixture 770 similar to the fixtures discussed above with reference to FIGS. 9–14. In this instance, the flexible body 732 of component 730 itself serves as the deformable barrier. When a vacuum is applied within working space 794, the pressure of the surrounding atmosphere urges the barrier downwardly, towards fixture 770 and thus urges the conductive features 744 and components 730 into engagement with the conductive features or contact pads 716 on wafer 710.

In the processes discussed above, the ability to conduct various process steps such as momentary heating to activate the solder or bonding material under normal, atmospheric conditions greatly facilitates mass production. Further, the deformable film reliably urges the conductive elements towards one another. Numerous variations and combinations of the features discussed above can be employed. For example, in the process of FIGS. 9–14, the conductive features on component 530 include elongated leads and are subsequently bent by moving the microelectronic elements away from component 530. As described in greater detail in U.S. Pat. No. 5,518,964, controlled deformation of the leads towards vertically extensive disposition provides numerous advantages. However the connection process according to this aspect of the invention can be applied to any conductive features. For example, the conductive features 744 and elements 730 may include simple contacts which cannot be deformed, and these contacts may be bonded to the contact pads 716 of a wafer. Also, bonding materials other than solders may be employed as, for example, eutectic bonding alloys, diffusion bonding alloys and thermoplastic compositions including conductive particles. The bonding material may be carried on the conductive elements of the component rather than on the conductive elements of the chip or other microelectronic element.

In a further variant, the temporary connecting elements 502 discussed above with reference to FIGS. 9–14 need not incorporate a breakable dummy pad as discussed above. Rather, these bonding elements may include a mass of adhesive 512 which can peel away from the component 530 or the microelectronic element 510 when these elements are forced away from one another. Alternatively or additionally, the adhesive in masses 512 may be arranged to melt or decompose during the momentary heating step used to melt solder masses 520 or earlier, when the components are heated to remove oxides prior to bonding. Alternatively or additionally, the adhesive masses may be arranged to melt or dissolve in the encapsulant when the encapsulant is injected.

Figure 19:
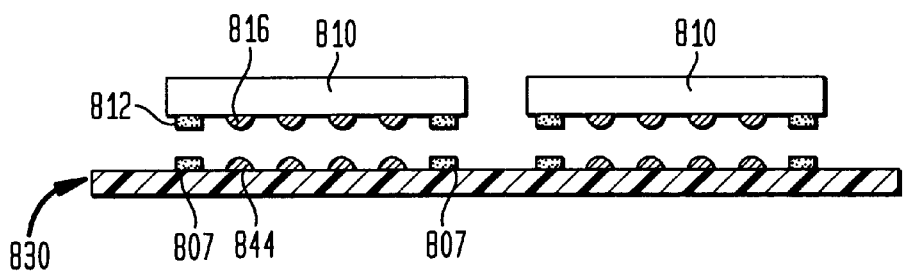

In a further variant, the temporary connecting elements or securements may include masses of an adhesive 812 (FIG. 19) which are initially carried on the chips 810 or other microelectronic elements and which are adapted to bond with the component 530 when the microelectronic elements are assembled with the component. The component may optionally have pads 807 adapted for bonding with the adhesive masses. These pads may optionally be breathable pads as discussed above. The adhesive masses and pads are positioned so that when the conductive features 816 of the chips are aligned with the conductive features 844 of the components, the adhesive masses are aligned with the pads. Alternatively, the adhesive masses 812 may be adapted to bond with the dielectric material of the component 830, and the pads 807 may be omitted. The adhesive masses may be applied to the chips before or after the chips are severed from a wafer. In other respects, the process is similar to those described above.

Figure 20:
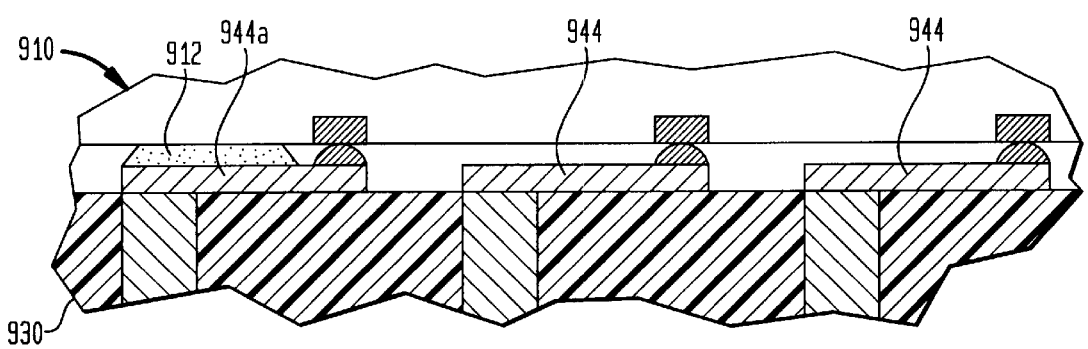
FIGS. 20 and 21 are fragmentary diagrammatic sectional views depicting components during processes according to still other embodiments of the invention.

In a further variant, shown in FIG. 20, the temporary securements may include adhesive masses 912 disposed over a first set 944*a* of the leads 944, so that the adhesive masses 912 extend between the leads of the first set and the microelectronic element 910. Thus, the leads 944*a* of the first set serve as pads or attachment points for the adhesive masses. Here again, the adhesive or temporary securement holds the microelectronic element in place relative to the component while the conductive elements or contacts 916 are bonded to the tip ends 945 of the leads by bonding material 920. The adhesive peels away from the microelectronic element, from the leads 944*a* of the first set, or both when the microelectronic element is moved away from the component in to bend the leads as discussed above. Alternatively or additionally, the adhesive may be degraded or dissolved as discussed above. Preferably, the first set of leads 944*a* includes less than all of leads 944. The leads 944*a* of the first set may be non-functional leads which do not provide electrical connections in the completed assembly. Therefore, any damage to these leads which may be caused by the forces which may be applied to these leads by the adhesive during movement will not disable the assembly. Alternatively, the leads of the first set may be robust enough to withstand these forces. As disclosed in U.S. Pat. No. 5,976,913, the disclosure of which is hereby incorporated by reference herein, some of the leads in a particular assembly may be used as restraining straps to constrain the movement of the microelectronic element and component. These leads, referred to as "restraining straps", can be shorter and stronger than the other leads in the assembly. The leads of the first set may constitute restraining straps.

Figure 21:
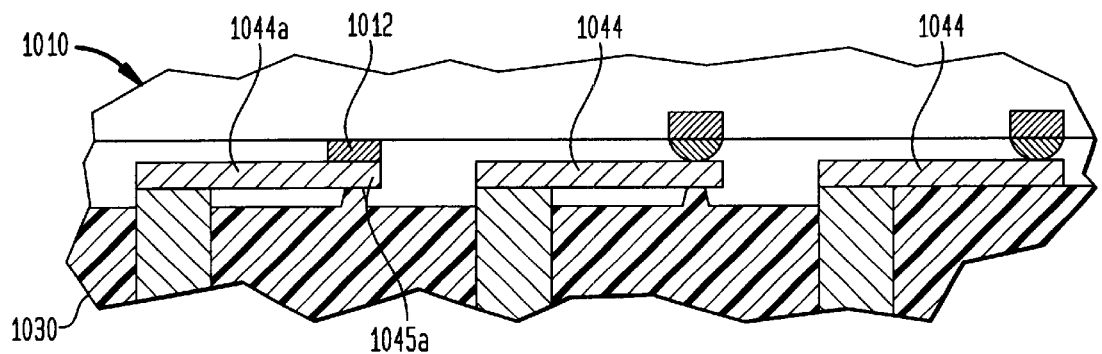

As shown in FIG. 21, the adhesive may overlie the tip ends 1045*a* of a first set 1044*a* of leads 1044. The tip ends of all of leads 1044, including first set 1044*a,* are releasably attached to the body of component 1030, as by small, breakable elements 1031 integral with the leads or the component body, or by a weak bond between the tip ends of the leads and the body, whereas the fixed or terminal ends 1046 are permanently fixed to the body. When the chip or microelectronic element 1010 is assembled to the component 1030, the adhesive bonds the microelectronic element to the tip ends 1045*a* of first-set leads 1044*a,* so that the adhesive and the releasable attachment between tip ends 1045*a* and the component form temporary securements between holding the microelectronic element in place on the component during bonding of the conductive features of the microelectronic element and component by conductive bonding material 1020. When the microelectronic element and component are moved away from one another, the tip ends of first-set leads 1045*a,* as well as the tip ends of the other leads, are peeled away from the component body, thereby breaking the temporary securement by release of the attachment between tip ends 1045*a* and the component body. In this embodiment, the adhesive need not be degraded or broken during the process. The leads 1044*a* of the first set adhesive may be non-functional leads, and may be restraining straps as discussed above. Alternatively, conductive bonding material may be provided for these leads as well, on portions of their tip ends not covered by adhesive, to establish electrical connection to the microelectronic element. In yet another variant, the adhesive used in the temporary securements may be electrically conductive, and conductive features (not shown) may be provided on the microelectronic element in registration with the tip ends 1045*a* of the leads in the first set. Thus, the leads of the first set may provide additional electrical connections.

As these and other variations and combinations of the features discussed above can be utilized without departing from the present invention as defined by the claims, the foregoing description of the preferred embodiments should be taken by way of illustration rather than by way of limitation of the claimed invention.

What is claimed is:

1. A method of bonding a microelectronic element to a connection component having a body which includes a polymer comprising:
   (a) juxtaposing said microelectronic element and said connection component with masses of bonding material disposed between electrically conductive features disposed on said connection component body and contacts on said microelectronic element;
   (b) heating said microelectronic element so as to activate said bonding material, and then cooling said microelectronic element leaving said contacts on said microelectronic element bonded to said conductive features on said connection component; and
   (c) maintaining said connection component at an average temperature below the glass transition temperature of the polymer in the connection component during said heating and cooling.

2. The method as claimed in claim 1 further comprising maintaining said microelectronic element and said connection component under a vacuum during said heating and cooling.

3. The method as claimed in claim 1 or claim 2 further comprising maintaining said connection component in heat transfer relationship with a temperature stabilizing element during said heating and cooling steps and maintaining said temperature stabilizing element at a temperature below said glass transition temperature.

4. The method as claimed in claim 1 or claim 2 wherein said heating of said microelectronic element includes applying radiant energy to said microelectronic element.

5. The method as claimed in claim 4 wherein said microelectronic element has a front face with said contacts thereon and has a rear face, said juxtaposing being performed so that said front face of said microelectronic element faces toward said connection component and said rear face faces away from said connection component, and wherein said radiant energy is applied by directing the radiant energy onto said rear face.

6. The method as claimed in claim 4 wherein said microelectronic element has a front face with said contacts thereon and has a rear face, said juxtaposing being performed so that said front face of said microelectronic element faces toward said connection component and said rear face faces away from said connection component, and wherein said radiant energy is applied by directing the radiant energy through the connection component onto said front face.

7. The method as claimed in 1 or claim 2 wherein said connection component includes a polymeric sheet, the method further comprising maintaining said polymeric sheet taut during said juxtaposing, heating and cooling.

8. The method as claimed in claim 7 further comprising maintaining said polymeric sheet taut by a rigid frame defining an opening, said polymeric sheet extending across said opening.

9. The method as claimed in 1 wherein microelectronic element has a passivation layer which is not wettable by said bonding material surrounding said contacts, further comprising providing said bonding material by contacting the passivation layer and contacts with said bonding material in a liquid state, whereby said bonding material adheres only to the contacts.

10. The method as claimed in claim 9 wherein said bonding material is a solder, further comprising maintaining said microelectronic element and said connection component under a vacuum during said heating and cooling.

11. The method as claimed in 1 wherein said connection component includes a polymeric element having a top surface and having said conductive features supported above said top surface by connecting elements, said connecting elements having cross-sectional areas smaller than the areas of said conductive features.

12. The method as claimed in 1 or claim 2 or claim 9 or claim 10 wherein said conductive features include the tip ends of leads on said connection component, the tip ends of being releasably connected to the connection component body, the leads having terminal ends fixed to said connection component body, the method further comprising moving the microelectronic element and the connection component body away from one another after bonding the contacts of the microelectronic element to the tip ends of the leads so as to bend the leads towards a vertically-extensive disposition.

13. The method as claimed in 1 or claim 2 wherein said microelectronic element has leads thereon and said leads have tip ends releasably mounted to said microelectronic element and fixed ends permanently secured to said microelectronic element, said contacts being provided at said tip ends of said leads, the method further comprising moving the microelectronic element and the connection component body away from one another after bonding the contacts of the microelectronic element to the conductive features on the connection component so as to bend the leads towards a vertically-extensive disposition.

* * * * *

UNITED STATES PATENT AND TRADEMARK OFFICE
CERTIFICATE OF CORRECTION

PATENT NO.    : 6,651,321 B2                                              Page 1 of 1
DATED         : November 25, 2003
INVENTOR(S)   : Masud Beroz, Belgacem Haba and Klaus-jurgen Wolter It is certified that error appears in the above-identified patent and that said Letters Patent is hereby corrected as shown below:

Column 3,
Line 16, "is" should read -- are --.

Column 13,
Line 40, "include" should read -- includes --.

Column 19,
Line 4, "is" should read -- are --.

Column 22,
Line 64, insert -- claim -- before "1".

Column 23,
Line 5, insert -- claim -- before "1".
Line 5, insert -- said -- before "microelectronic".
Lines 16 and 22, insert -- claim -- before "1".

Column 24,
Line 1, after "ends" delete -- of --.
Line 10, insert -- claim -- before "1".

Signed and Sealed this

Second Day of March, 2004

JON W. DUDAS
*Acting Director of the United States Patent and Trademark Office*